United States Patent [19]

Ochiai et al.

[11] 4,075,697

[45] * Feb. 21, 1978

[54] APPARATUS FOR MONITORING TWO ELECTRIC QUANTITIES BY COMBINING THREE CONSECUTIVE SAMPLES OF EACH QUANTITY

[75] Inventors: Tomoyoshi Ochiai; Takeshi Hayashi; Mituhiro Furuse, all of Tokyo, Japan

[73] Assignees: Tokyo Denryoku Kabushiki Kaisha; Kabushiki Kaisha Meidensha, both of Tokyo, Japan

[*] Notice: The portion of the term of this patent subsequent to Feb. 1, 1994, has been disclaimed.

[21] Appl. No.: 734,539

[22] Filed: Oct. 21, 1976

Related U.S. Application Data

[63] Continuation of Ser. No. 508,629, Sept. 23, 1974, Pat. No. 4,006,348.

[30] Foreign Application Priority Data

Oct. 1, 1973  Japan ............................... 48-110856
Oct. 1, 1973  Japan ............................... 48-110857

[51] Int. Cl.² ..................... G06F 15/20; G01R 13/02
[52] U.S. Cl. ............................. 364/481; 324/76 R; 328/151; 340/248 R; 364/736
[58] Field of Search ............... 235/151.31; 324/76 R, 324/78 R, 78 D, 79 D, 83 D, 103 R; 328/151; 340/248 R

[56] References Cited

U.S. PATENT DOCUMENTS

| 3,758,763 | 9/1973 | Nohara et al. ............... 235/151.31 |
| 3,795,008 | 2/1974 | Kolsrud et al. ..................... 328/151 |
| 4,006,348 | 2/1977 | Ochiai et al. ................. 235/151.31 |

Primary Examiner—Malcolm A. Morrison
Assistant Examiner—Errol A. Krass
Attorney, Agent, or Firm—Flynn & Frishauf

[57] ABSTRACT

Apparatus for monitoring two sinusoidal electric quantities of a common period, comprises two similarly timed samplers, an arithmetic unit for combining, in accordance with a preselected relation, three consecutive samples of each electric quantity so as to produce an output signal which is independent of time and phase relations between the sampling pulses and the respective quantities. The output signal may be determined solely by peak values of the respective quantities, phase difference between the electric quantities, and timing period. The apparatus further comprises a discriminator circuit having a reference level and responsive to the output signal for producing a signal for use in monitoring the electric quantities.

4 Claims, 4 Drawing Figures

APPARATUS FOR MONITORING TWO ELECTRIC QUANTITIES BY COMBINING THREE CONSECUTIVE SAMPLES OF EACH QUANTITY

This is a continuation, of application Ser. No. 508,629, now U.S. Pat. No. 4,006,348, filed Sept. 23, 1974.

BACKGROUND OF THE INVENTION

This invention relates to apparatus for monitoring a.c. electric quantities, such as electric currents, voltages, and charges. Apparatus according to this invention is particularly useful in supervisory control of an electric power system.

In a control system for an electric power system, high-speed operation is more and more important as the power system becomes greater in scale and intricate in construction and as the voltage on the transmission line is rendered higher. On the other hand, it is already known that application of digital techniques to supervision of a.c. electric quantities is preferable in such a supervisory control system. The reasons are described in patent application Ser. No. 386,382 filed Aug. 7, 1973, and now abandoned by Toshio Takagi, assignor to Tokyo Denryoku Kabushiki Kaisha, one of the instant assignees. For high-speed operation, it is desirable to derive a control signal of a monitoring or supervisory control system from a small number of analog or digital samples of the electric quantities being monitored. In addition, it has been heretofore necessary to synchronize sampling pulses used at different points of a supervisory control system even where unnecessary according to the present invention.

SUMMARY OF THE INVENTION

It is therefore a general object of the instant invention to provide apparatus for monitoring a.c. electric quantities by the use of a small number of samples of the respective quantities being monitored.

It is a specific object of this invention to provide apparatus for monitoring two substantially sinusoidal electric quantities of a common frequency or period by the use of only three consecutive samples of each of the electric quantities.

It is another specific object of this invention to provide apparatus of the type described, operable under certain circumstances without the problem of maintaining synchronism of electric quantity sampling.

In the present invention, two samplers and a source of sampling pulses are provided for sampling a first substantially sinusoidal electric quantity of a first period and a second substantially sinusoidal electric quantity of a second period which is nominally or normally substantially equal to the first period, to the two samplers producing first and second discrete signals at individual sampling points defined by the sampling pulses. The first and second discrete signals are representative of samples of the first and second electric quantities, respectively. In addition to the two samplers, the present invention further comprises an arithmetic unit for carrying out a combination, in accordance with a preselected relation, on the electric quantities represented by the discrete signals derived at three consecutive ones of the sampling points from each of the electric quantities to produce a first result signal representative of a variable which is independent of time and of phase relations between the sampling pulses and the respective ones of electric quantities but is dependent on the preselected relation. The invention further comprises a discriminator circuit responsive to a reference level representative of a predetermined value of the variable and to the first result signal for producing a second result signal representative of said preselected relation.

As will later be described with reference to the accompanying drawing, this invention is derived from a result of systematic mathematical studies on a.c. electric quantities, particularly on substantially sinusoidal electric quantities, and from considerations relating to practical application of the results obtained. In particular, the substantially sinusoidal electric quantities of a common period are dealt with in pairs in accordance with this invention. It has thus become possible to derive from only three consecutive samples of each of a pair of substantially sinusoidal electric quantities of a common period a variable which may be termed a d.c. sample or an effective sample, the word "effective" being used here as in the "effective" value of an a.c. electric current or voltage. The variable may be determined solely by peak or effective values of the respective electric quantities, phase difference between the electric quantities, and the sampling period. It is therefore possible with an arrangement according to the present invention to measure one of the peak values and the phase difference when the other two are known. When the first and second periods are different, the first result signal becomes indicative of this fact. The expression "nominally" or "normally" is used in the next preceding paragraph in order to include in the scope of this invention an arrangement of the type described which is for use in supervising or monitoring any difference between the first and second periods. If two a.c. electric quantities of a common fundamental frequency are not sinusoidal but have higher harmonics or d.c. components, use may be made of filter means to derive a pair of substantially sinusoidal electric quantities through which the original a.c. electric quantities may be monitored with sufficient accuracy and precision. Use of filter or other frequency conversion means is applicable to two a.c. electric quantities having harmonically related fundamental frequencies. In the case of more than two a.c. electric quantities, use may be made of a plurality of arrangements according to this invention.

DESCRIPTION OF THE PREFERRED EMBODIMENTS

Figure 1:
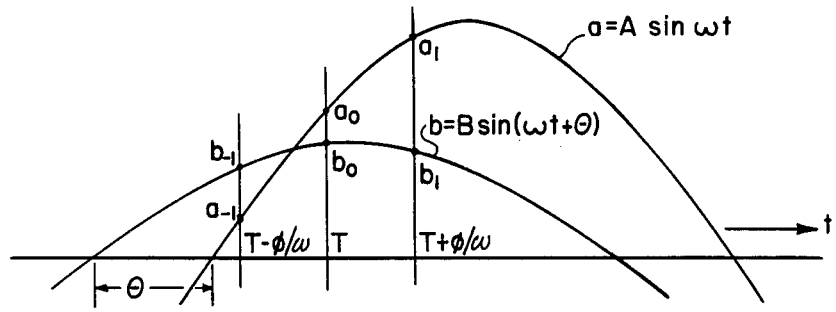
FIG. 1 graphically shows two sinusoidal electric quantities of a common period and samples thereof for describing the principles on which the present invention is based.

Referring to FIG. 1, the principles on which the present invention is based will be described at first with reference to simple examples. Two sinusoidal electric quantities $a$ and $b$ of a common frequency $f$ may be represented by:

$$\begin{cases} a = A\sin\omega t \\ b = B\sin(\omega t + \theta), \end{cases}$$

Where $\omega = 2\pi f$, $A$ and $B$ represent peak values or amplitudes of the respective electric quantities, and $t$ and $\theta$ represent the time and the phase difference between the electric quantities. It is now presumed that the electric quantities are sampled by the use of a single sampling or timing pulse train of a sampling period or interval $\phi/\omega$ at an optional reference time $T$ and at individual sampling or time points $T + i\phi/\omega (i = \ldots, -1, 0, 1, \ldots)$. Samples derived at three consecutive sampling points may be given by:

$$\begin{cases} a_{-1} = A\sin(\omega T - \phi) \\ b_{-1} = B\sin(\omega T + \theta - \phi), \end{cases}$$

$$\begin{cases} a_0 = A\sin\omega T \\ b_0 = B\sin(\omega T + \theta), \end{cases}$$

and $$\begin{cases} a_1 = A\sin(\omega T + \phi) \\ b_1 = B\sin(\omega T + \theta + \phi), \end{cases}$$

where $a_i$ and $b_i$ represent a sample pair derived at a sampling point $T + i\phi/\omega$. Products of the individual sample pairs are:

$$a_{-1}b_{-1} = K[\cos\theta - \cos(2\omega T + \theta)\cos 2\phi - \sin(2\omega T + \theta)\sin 2\phi], \quad (1)$$

$$a_0 b_0 = K[\cos\theta - \cos(2\omega T + \theta)], \quad (2)$$

and $$a_1 b_1 = K[\cos\theta - \cos(2\omega T + \theta)\cos 2\phi + \sin(2\omega T + \theta)\sin 2\phi], \quad (3)$$

where $K = AB/2$. From Equations (1) through (3):

$$a_{-1}B_{-1} + a_1 b_1 - 2a_0 b_0 \cos 2\phi = 2AB\cos\theta\sin^2\phi \quad (4)$$

From Equations (1) and (3):

$$a_{-1} - a_1 = -2A\sin\phi\cos\omega T,$$

$$b_{-1} - b_1 = -2B\sin\phi\cos(\omega T + \theta),$$

and $$(a_{-1} - a_1)(b_{-1} - b_1) = 4K\sin^2\phi[\cos\theta + \cos(2\omega T + \theta)] \quad (5)$$

follow. By the use of Equations (2) and (5):

$$(a_{-1} - a_1)(b_{-1} - b_1) + 4a_0 b_0 \sin^2\phi = 4AB\cos\theta\sin^2\phi \quad (6)$$

is obtained.

It is now understood that the right sides of Equations (4) and (6) are variables which are independent of the time $t$ and that Equations (4) and (6) hold for each act of three consecutive sample pairs. From physical considerations of the equations obtained above, it is appreciated that use of a pair of samples, such as $a_2$ and $b_{-2}$ and accordingly $a_2 - I_4$ and $b_{31\,2} - b_0$, derived at different sampling points instead of a pair derived at each sampling point and use of different sampling pulse trains having no phase relation therebetween but a common sampling period, namely, sampling pulses defining sampling points $T_a + i\phi/\omega$ and $T_b + i\phi/\omega$, where $T_a$ and $T_b$ represent optional reference times, also make it possible to derive a d.c. or effective sample although the sample or variable is now dependent further on the phase differences between the sampling points and the sampling pulse trains. In any event, the variable is calculated according to the left sides of Equations (4) and (6) by algebraically summing up five terms at most. Furthermore, one of the at most five terms is given by a product of three factors consisting of two samples and a constant while each of the remaining terms is given by a product of two samples. The constant may be 1.

When a single substantially sinusoidal electric quantity $a$ is dealt with, Equations (4) and (6) become:

$$a_{-1}^2 + a_1^2 - 2a_0^2\cos 2\phi = 2A^2\sin^2\phi \quad (7)$$

and $$(a_{-1} - a_1)^2 + 4a_0^2\sin^2\phi = 4A^2\sin^2\phi \quad (8)$$

because $\frac{1}{4} = 0$. On the other hand, Equations (4) and (6) become simpler, thus:

$$a_{-1}b_{-1} + a_1 b_1 - a_0 b_0 = (AB\cos\theta)/2 \quad (9)$$

and $$(a_{-1} - a_1)(b_{-1} - b_1) + a_0 b_0 = AB\cos\theta \quad (10)$$

when the sampling period is 30° in terms of the phase angle of the electric quantities, namely, 1/12 of the period $1/f$ of the electric quantities. For use in monitoring a.c. electric quantities and in controlling an electric power system for protection and other purposes, a 30° sampling period is practical in view of the precision and the transmission capacity of a link between a point where each sample is produced and a location where the samples are combined with each other. When the electric quantities are sampled at 15° sampling intervals as is not seldom in supervisory control of an electric power system, every other 15° interval sample may be used as the samples used in Equations (9) and (10). Equations (7) and (8) similarly become:

$$a_{-1}^2 + a_1^2 - a_0^2 = A^2/2 \quad (11)$$

and $$(a_{-1} - a_1)^2 + A_0^2 = A^2 \quad (12)$$

when the single electric quantity $a$ is sampled at 30° sampling intervals. Practical applications of Equations (7), (8), (11), and (12) will later be described in conjunction with an arrangement according to a second embodiment illustrated with reference to FIG. 3.

Figure 2:
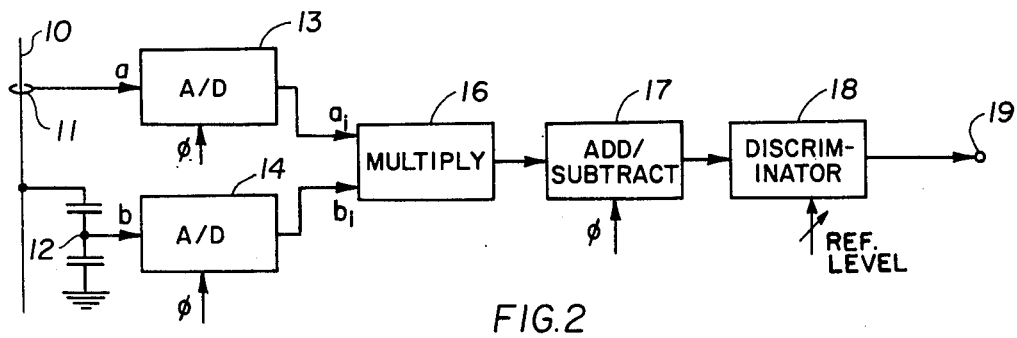
FIG. 2 is a block diagram of an arrangement according to a first embodiment of this invention.

Referring now to FIG. 2, an arrangement according to a first embodiment of this invention for discriminating between senses or polarities of an a.c. electric current flowing through a transmission line 10 with respect to an a.c. electric voltage on the line 10, comprises current transformer means 11 responsive to the electric current for deriving a substantially sinusoidal current signal $a$ of a frequency of the fundamental frequency of the current, potential device means 12 responsive to the voltage for deriving a substantially sinusoidal voltage signal $b$ of the above-mentioned frequency, and analog-to-digital converter circuits 13 and 14 responsive to sampling pulses of a predetermined period $\phi$ supplied from a sampling pulse source (not shown) for sampling the current and voltage signals and converting the current and voltage analog samples to current and voltage digital samples $a_i$ and $b_i$, respectively. The arrangement further comprises a multiplier circuit 16 for calculating a first product $a_ib_i$ of a pair of current and voltage digital samples derived in response to each sampling pulse and for multiplying each first product by a factor $2\cos2\phi$ retained thereby to produce a second product $2a_ib_i\cos2\phi$, an adder-subtractor circuit 17 responsive to the sampling pulses for holding the first and second products and for calculating at each sampling point an algebraic sum $a_{-1}b_{-1} + a_1b_1 - 2a_0b_0\cos2\phi$ given in the left side of Equation (4), and a discriminator or decision circuit 18 responsive to the sign of each algebraic sum for delivering a discrimination or decision signal to an output terminal 19. By the discrimination signal, it is possible to determine the sense or polarity of the current. If it is desired to put a circuit breaker (not shown) into operation when the current is of a polarity opposite to the voltage, the discrimination signal of a certain level (reference signal) may then be supplied through the output terminal 19 to an operating circuit (not shown) for the circuit breaker to cut off the same.

The discriminator 18 may retain a reference level $2AB\cos\theta_0\sin^2\phi$ determined in consideration of the peak or effective values of the current and voltage and a predetermined value $\theta_0$ of the phase difference $\theta$ therebetween to produce a discrimination signal of a certain level when the phase difference exceeds the predetermined value.

Further referring to FIG. 2, it will now readily be understood that the adder-subtractor circuit 17 is operable by timing or clock pulses which are independent of the sampling pulses used in the analog-to-digital converter circuits 13 and 14. In fact, the multiplier and adder-subtractor circuits 16 and 17 may be an arithmetic unit of an electronic digital computer. Furthermore, the discriminator 18 may be comprised by the computer. The computer may be the high-speed data processing unit 78 described in the referenced patent application Ser. No. 386,382, now abandoned. Alternatively, the multiplier and adder-subtractor circuits 16 and 17 may be one of the central processing units $C_1, C_2, \ldots$ described in patent application Ser. No. 482,501 filed June 24, 1974, now U.S. Pat. No. 3,949,374 by Toshio Takagi et al., assignors to the present assignees, while the discriminator 18 may be the particular central processing unit $C_k$ described therein. Again, the circuit elements 16 through 18 may be an electronic analog computer if analog samples are operated or instead of the digital samples. The discrimination signal of a certain level may be called a control or an alarm signal in accordance with the use thereof. With the above-mentioned reference level adjusted to $2AB\sin^2\phi$, it is possible to derive a signal representative of the phase difference $\theta$ by dividing the algebraic sum by the reference level and by calculating the arc casine of the quotient at the discriminator or decision circuit 18 as termed herein. As will also be readily acknowledged, the analog-to-digital conversion is carried out in this embodiment merely because it is preferable to do so in many cases. It is additionally noted here that signals representative of the samples, the products, the algebraic sum, and the like are denoted merely by the values represented thereby for brevity of description.

Figure 3:
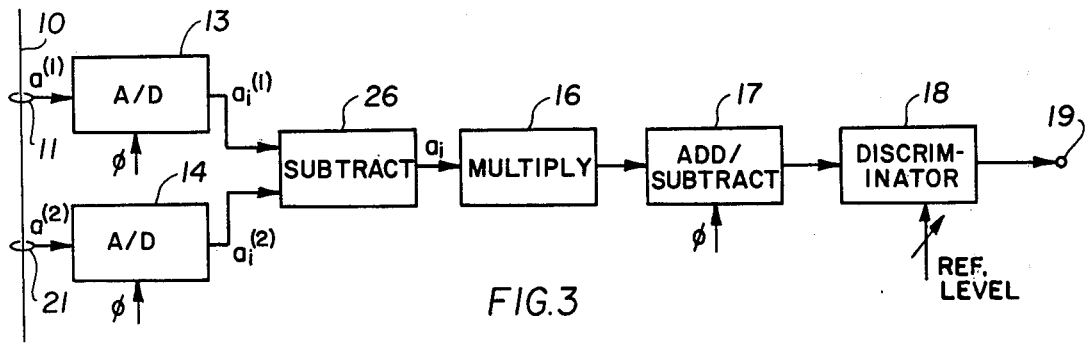
FIG. 3 is a block diagram of an arrangement according to a second embodiment of this invention.

Referring to FIG. 3, an arrangement according to a second embodiment of the invention for detecting a problem in a transmission line 10 by monitoring an a.c. electric current flowing therethrough at points adjacent to both ends of the line 10, comprises first current transformer means 11 responsive to the current in the vicinity of one end of the line 10 for deriving a first substantially sinusoidal signal $a^{(1)}$ of a period equal to the fundamental period of the current, second current transformer means 21 responsive to the current in the vicinity of the other line end for deriving a second substantially sinusoidal signal $a^{(2)}$ of the same period, analog-to-digital converter circuits 13 and 14 of the type described in conjunction with the first embodiment of FIG. 2 for producing first and second current digital samples $a_i^{(1)}$ and $a_i^{(2)}$, and a subtractor 26 for calculating a difference between the first and second samples derived at each sampling point to produce a current difference digital sample $a_i$. The subtractor 26 may be included in an electronic digital or, as the case may be, an analog computer. It is pointed out here that the current difference digital samples are representative of a single electric quantity at the respective sampling points and that the single electric quantity is substantially sinusoidal. Here, the single electric quantity may be called a differential current. It now follows the Equation (7), (8), (11), or (12) is applicable to the current difference samples. Consequently, the arrangement according to the second embodiment further comprises a multiplier circuit 16, similar to that described in connection with the first embodiment, of FIG. 2 for producing squares $a_i^2$ and products $2a_i^2\cos2\phi$, an adder-subtractor circuit 17 of the type already described for calculating an algebraic sum $a_{-1}^2 + a_1^2 - 2a_0^2\cos2\phi$ at each sampling point, and a discriminator or decision circuit 18 of the type also described for delivering an alarm signal to an output terminal 19 when the algebraic sum is not equal to zero. In connection with the right sides of Equations (7), (8), (11), and (12), it is now understood under the circumstances that A represents that peak value of the differential current which should be equal to zero in the absence of troubles in the transmission line 10. It is further understood that use of samples derived at different sampling points from a single electric quantity instead of the samples used in Equations (7), (8), (11), and (12) results in an amplitude A which is twice as large as that of the original electric quantity when the difference is calculated between the samples derived at 180° intervals.

Figure 4:
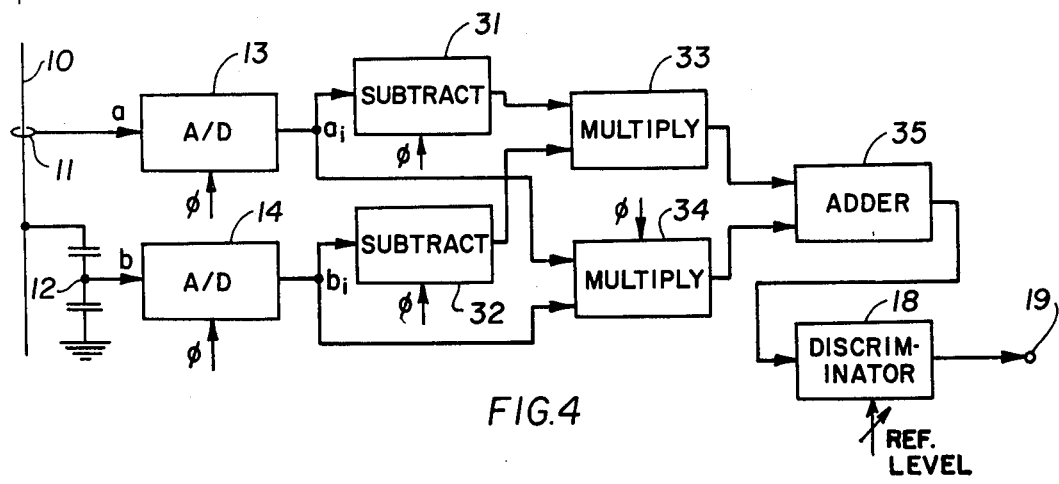
FIG. 4 is a block diagram of an arrangement according to a third embodiment of this invention.

Referring to FIG. 4, an arrangement according to a third embodiment of this invention for discriminating between senses of an a.c. electric current $a$ flowing through a transmission line 10 with respect to an a.c. electric voltage $b$ of the line 10, comprises current transformer means 11, potential device means 12, and analog-to-digital converter circuits 13 and 14, all as described in conjunction with the first embodiment of FIG. 2. The arrangement according to the third embodiment of FIG. 4 further comprises a first subtractor circuit 31 responsive to the sampling pulses for holding current digital samples $a_1$ and for deriving a current difference $a_{-1} - a_1$ at each sampling point, a second subtractor circuit 32 for likewise deriving a voltage difference $b_{-1} - b_1$, a multiplier 33 for producing a first product $(a_{-1} - a_1) \times (b_{-1} - b_1)$ at each sampling point, a multiplier circuit 34 responsive to the sampling pulses for holding the current and voltage digital samples for one sampling period $\phi$ and responsive further to a factor $4\sin^2\phi$ retained thereby for producing a second product $4a_0b_0\sin^2\phi$ at each time of production of the first product $(a_{-1} - a_1)(b_{-1} - b_1)$, an adder 35 for producing a sum $(a_{-1} - a_1)(b_{-1} - b_1) + 4a_0b_0\sin^2\phi$ given in the left side of Equation (6), and a discriminator or decision circuit 18 of the type described in conjunction with the first embodiment of FIG. 2 for delivering, for example, a control signal to an output terminal 19 when the sum is smaller than a reference level $4AB\cos\theta_0\sin^2\phi$ retained thereby. As described, the elements 31 through 35 and 18 may either be part of an electronic digital computer or, if analog samples are dealt with instead of the digital samples, an electronic analog computer.

In connection with the embodiments above described, it will have readily been understood that the factors used in the multiplier circuit 16 should be adjusted in compliance with the sampling period used. The discriminator or decision circuit 18 may be provided with an adjustable reference level. Also, a pair of sampling pulse sources may be used without synchronization therebetween for the respective analog-to-digital converter circuits 13 and 14.

What is claimed is:

1. Apparatus for monitoring a variable derived from a first substantially sinusoidal electric quantity having a first period and a second substantially sinusoidal electric quantity having a second period nominally substantially equal to said first period, said variable being independent of time, comprising:

a source of sampling pulses of a predetermined sampling period;

two samplers responsive to said sampling pulses and respectively responsive to said first and second electric quantities for respectively deriving first and second discrete signals from said first and second electric quantities at individual sampling points defined by said sampling pulses, said first and second discrete signals being representative of samples of said first and second electric quantities, respectively;

at least one multiplier unit coupled to said samplers for calculating at least one product of samples which are representative of at least one pair of said discrete signals to produce at least one product signal representative of said product, one and the other of said at least one pair being derived from said first and second electric quantities, respectively;

arithmetic means coupled to said multiplier unit for carrying out at least an algebraic addition of a signal representative of at least one of the product signals produced by said at least one multiplier unit with another signal in response to the discrete signals derived at three consecutive ones of said sampling points to produce a first result signal representative of said variable, said variable being further independent of phase relations between said sampling pulses and respective ones of said electric quantities; and a discriminator circuit coupled to said arithmetic means and responsive to said first result signal for producing a second result signal when said variable exceeds a given reference value.

2. Apparatus according to claim 1, wherein said source of sampling pulses provides pulses of a single sampling pulse train; and said three consecutive sampling points are defined by three consecutive pulses of said sampling pulse train, said arithmetic means producing said first result signal solely as a function of the peak values of said first and second electric quantities, the phase difference between said first and second electric quantities, and said sampling and first periods.

3. Apparatus according to claim 1, wherein said arithmetic unit includes a first subtractor unit coupled to the output of one of said samplers and responsive to the sampling pulses for holding a digital sample and for deriving a difference sample at each sample point which is the difference between the sample at a sample point and a sample at a prior sample point, a second subtractor unit coupled to the other of said samplers and responsive to the sampling pulses for holding a digital sample and for deriving a difference sample at each sample point which is the difference between the sample at a sample point and a sample at a prior sample point, a first multiplier unit coupled to the outputs of said first and second subtractor units for producing an output signal which is a function of the product of the outputs of said first and second subtractor units, a second multiplier unit responsive to the outputs of said samplers and to the sampling pulses for producing an output signal which is a function of the product of the outputs of said samplers, and an adder unit coupled to the outputs of said first and second multiplier units for adding the outputs of said first and second multiplier units to produce said first result signal.

4. Apparatus according to claim 3 wherein said second multiplier circuit holds the outputs of said samplers for one sampling period and produces an output signal which is a function of the product of the outputs of said samplers at a first period at each time said first multiplier unit produces an output for the next occurring sampling period.

* * * * *